United States Patent Office 3,519,492

Patented July 7, 1970

3,519,492

PROCESS FOR THE PRODUCTION OF PURE SEMICONDUCTOR MATERIALS

James O. Huml and Gilbert S. Layne, Midland, and Willard A. Williams, Bay City, Mich., assignors to The Dow Chemical Company, Midland, Mich., a corporation of Delaware No Drawing. Filed Dec. 21, 1967, Ser. No. 692,289
Int. Cl. B01j *17/00;* C01b *27/00;* C01g *9/08*
U.S. Cl. 148—1.6 20 Claims

ABSTRACT OF THE DISCLOSURE

A process for producing semiconductor material from semiconductor source materials which comprises: contacting a semiconductor source material with a subsulfide forming agent under an otherwise inert atmosphere and at a sufficient temperature to form a gaseous product mixture containing at least gaseous subsulfides of the semiconductor material; lowering the temperature of the gaseous product mixture sufficiently below the subsulfide formation temperature at the pressure being utilized to dissociate and precipitate purified semiconductor material.

Background of the invention

At the present time the most common method for producing semiconductor materials consists of employing a halogen compound transport medium to produce gaseous halogens of the semiconductors. The halogens, however, are extremely corrosive and at the high working temperatures employed require extensive quality control and the use of special operating equipment.

Also, a method for the vapor transport of substantially pure semiconductor materials such as gallium arsenide, germanium, silicon and the like from one point to another is disclosed by Sirtl et al. in U.S. 3,290,181. According to the method described therein a substantially pure semiconductor material is contacted at a high temperature with a gaseous mixture of $H_2S$ and hydrogen. The semiconductor material is thereupon converted to a subsulfide and transported as a vapor to a different location having a temperature at which the subsulfide of the semiconductor material will dissociate, and precipitating the semiconductor material as an epitaxial layer. This reference teaches the use of hydrogen to $H_2S$ ratios of at least a 100 to 1 and preferably between 200 to 1 and 500 to 1.

Furthermore, heretofore, separate and distinct processes have been required for first producing pure semiconductor material from source materials and a second for depositing epitaxial layers and the like from the pure materials. Because of this, duplication of equipment and excessive processing time, of necessity, must be employed.

It has now been discovered that semiconductor materials can be produced from semiconductor source materials containing substantial amounts of impurities without the disadvantages associated with the use of halogen compounds or mixtures of sulfur compounds with a reducing gas such as, for example, hydrogen as a transport medium. Furthermore, semiconductor materials can be produced from a semiconductor source material containing impurities and deposited directly onto a substrate to form an epitaxial layer in one operational step. Thus, the present invention provides an improved method whereby, unlike the Sirtl et al. method, substantially impure semiconductor source materials can be used as the starting material to form, among other products, semiconductor epitaxial layers.

Summary of the invention

"Semiconductor material" as employed herein designates certain forms of the elements or combinations of the elements of Groups II, III, IV, V and VI of the A and B columns of the Periodic Table, and of such a purity that they can be employed in the manufacture of transistors, rectifiers, modulators and other like electrical components. Included by way of example are certain purified forms of single elements such as Si, Ge and Se; specific intermetallic combination of elements such as GaAs and InSb; and sulfide salts such as, for example, CdS and ZnS.

"Semiconductor source material" as employed herein designates materials which contain semiconductor materials as previously defined herein or semiconductor forming materials which may be associated with impurities in an amount which prevents the semiconductor source material from being employed in the manufacture of electrical components. Semiconductor forming materials include, for example, certain elements which are not in themselves employed as semiconductors, such as elemental cadmium and zinc, but which can be employed to produce sulfide salt semiconductors such as, for example, CdS and ZnS.

The present invention relates to an improved process for producing semiconductor materials from semiconductor source materials. A semiconductor source material is contacted with a subsulfide forming agent at a sufficient temperature to produce a gaseous mixture containing at least gaseous subsulfides of the semiconductor material. The temperature of the gaseous product mixture, containing subsulfide compounds of at least the semiconductor materials, is sufficiently reduced to dissociate the gaseous compounds and at least highly purified semiconductor materials are precipitated. All of the dissociation products may be precipitated by using a temperature gradient wherein different gaseous compounds are dissociated and precipitated at different temperature levels. The dissociation temperature is affected by the pressure employed. The process can be carried out at other than atmospheric pressure and diluent inert gases such as, for example, argon, may be employed.

By taking advantage of the differences in subsulfide formation and dissociation temperatures of different compounds, it is possible, in the practice of the improved process of the present invention, to purify semiconductor source materials containing appreciable amounts of impurities. By this process single element semiconductor materials such as, for example, Si and Ge; intermetallic semiconductor materials, such as, for example, GaAs and InSb, and sulfide salt semiconductor materials such as, for example, CdS and ZnS can be produced directly from impure semiconductor source materials.

Preferred embodiments

Usually in practice, a semiconductor source material, wherein the impurities are characterized in that they do not form gaseous subsulfides or in that they form gaseous subsulfides which are more volatile or which are less volatile than the subsulfides of the semiconductor materials, is contacted with a subsulfide forming agent at a sufficient temperature to form a gaseous product mixture containing gaseous subsulfides of at least a portion of the semiconductor material. At least a portion of the gaseous semiconductor subsulfide compound is dissociated by lowering the temperature of the gaseous subsulfide compound and highly purified semiconductor materials are precipitated, usually onto a prepared substrate. The temperature of the gaseous subsulfide compounds can be lowered, for example, by conducting the gaseous product mixture into a zone having a lower temperature than the gaseous subsulfide formation temperature. Thus, highly pure semiconductor materials can be produced from substantially impure semiconductor source materials without the need for reducing gases such as hydrogen. The entire process may be conducted at other than atmospheric pressures and for purposes of economy, control of transport rate, and control of precipitation temperature, inert diluent gases may be employed.

In another embodiment of the present invention, a temperature gradient may be provided along the length of the reactor where the semiconductor material is to be precipitated. Extremely high purity semiconductor material can be produced in this manner. In this embodiment the gaseous product mixture, containing at least the subsulfides of the semiconductor material, is passed through the temperature gradient and in contact with a substrate. The less volatile gaseous products precipitate at the highest temperature range; the semiconductor materials are precipitated at a slightly lower temperature and at a different location and the more volatile products precipitate at a lower temperature in the cooler portions of the reactor, or are removed by venting.

The subsulfied forming agent which is employed will depend on the particular type of semiconductor material which is to be produced. When the semiconductor source material contains single element semiconductor materials such as, for example, Si, Se, Ge, or intermetallic compounds such as, for example, GaAs, the subsulfide forming agent usually consists of a sulfur containing source selected from the group consisting of $H_2S$, S, normal valent metallic sulfied salts, such as, for example, $GeS_2$ $SiS_2$ and mixtures of $H_2S$, and S with one normal valent metallic sulfide salt thereof. It is usually preferred that when the subsulfide forming agent consists of a normal valent metal sulfide salt the cation of the salt should, in its elemental form, be the semiconductor material which is to be produced and in the case of intermetallic semiconductors it should correspond to the most reactive element in the intermetallic compound.

It is preferred that the subsulfied forming agent be employed in an amount at the maximum about equal to that which is stoichiometerically required to form gaseous subsulfides with the single element or the most reactive element in intermetallic semiconductor materials. If more than stoichiometric amounts are employed in producing intermetallic semiconductor materials there may be a loss in product due to the formation of sulfide compounds containing the less reactive element upon dissociation of the gaseous products. For example, when GaAs semiconductor material is to be produced, the following mechanism of the reaction is theorized:

$$\underset{\text{(impure)}}{GaAs} + \underset{\substack{\text{(subsulfide}\\\text{forming agent)}}}{Ga_2S_3} \xrightarrow{\text{heat}} 3Ga_2S_{(g)} + 4As_{(g)} \longrightarrow \underset{\text{(pure)}}{4GaAs} + Ga_2S_{3(g)}$$

If more than stoichiometric amounts of the subsulfied forming agent are employed, some of the $As_{(g)}$ may combine with the subsulfied agent to form sulfides which will not completely recombine with Ga upon the dissociation of the gaseous mixture at a lower temperature. This, of course, should be avoided if maximum recovery of the intermetallic semiconductor material is to be accomplished.

When the semiconductor source material contains a sulfied salt such as, for example, CdS, ZnS and the like, the subsulfied forming agent consists of the elemental form of the material corresponding to the cation of the semiconductor sulfide salt. For example, Cd or Zn metal is employed as the subsulfide forming agent when the semiconductor source material contains CdS or ZnS. The mechanism of this reaction is theorized as:

$$\underset{\substack{\text{(impure}\\\text{source)}}}{CdS + Cd} \xrightarrow{\text{heat}} Cd_2S_{(g)} \xrightarrow[\text{cool}]{} \underset{\text{(pure)}}{CdS} + Cd_{(g)}\uparrow$$

When the semiconductor source material contains a single element which can be employed to form a sulfide salt semiconductor material such as, for example, CdS from Cd, the subsulfide forming agent usually consists of a sulfide containing compound selected from the group consisting of $H_2S$, S and normal valent metallic sulfide salts wherein the cation of the salt usually corresponds to the single element in the source material. The mechanism of this reaction is theorized as follows:

$$\underset{\substack{\text{(from}\\\text{impure}\\\text{source)}}}{Cd} + \underset{\text{forming agent}}{\text{subsulfied}} \xrightarrow{\text{heat}} Cd_2S \xrightarrow[\text{cool}]{} \underset{\substack{\text{(solid}\\\text{pure)}}}{CdS} + Cd_{(g)}$$

and specifically with CdS as the subsulfide forming agent as:

$$\underset{\substack{\text{(impure}\\\text{source)}}}{Cd + CdS} \xrightarrow[\text{heat}]{} Cd_2S_{(g)} \xrightarrow[\text{cool}]{} \underset{\text{(pure)}}{CdS} + Cd_{(g)}\uparrow$$

The subsulfide forming agents employed as herein can can be used alone, in admixture with one another or as previously indicated in admixture with an inert diluent gas such as, for example, argon, neon, helium, krypton, xenon and mixtures thereof. The reaction, however, should be conducted under an inert atmosphere and may be conducted at other than atmospheric pressures.

A semiconductor source material which has been employed to prepare silicon semiconductor material by the present process is ferrosilicon which contained from about 40 to about 98 percent by weight of silicon. Other source materials can be employed and materials containing at least 1000 parts per million of impurities and usually containing considerably larger amounts of impurities can be employed to prepare semiconductor materials for use in electrical components.

The subsulfide forming agent, which as previously indicated, is usually at least partially regenerated during the dissociation reaction, may be vented from the system or preferably it is recycled to again contact the impure semiconductor source material.

Various forms of semiconductor material may be prepared by the present process. A monocrystalline epitaxial layer of Si semiconductor material was formed on a monocrystalline substrate by the present process. Likewise, a polycrystalline layer of Si semiconductor material was formed on an essentially pure polycrystalline substrate. In addition, various needle shaped crystals of Si semiconductor material were prepared along with the layers.

The temperature employed in the present process will vary depending on the nature of the semiconductor materials and subsulfide forming agents employed herein. The initial temperature is that which is required to form gaseous subsulfides of at least the semiconductor materials in the semiconductor source material. For example, when silicon is to be produced, a formation temperature of greater than about 1000° C. is usually employed. The dissociation temperature is not greater than the subsulfide formation temperature and usually is at least about 10 degrees below the formation temperature.

When a temperature gradient is employed the temperature along the gradient should range from the formation temperature of the gaseous subsulfides to about room temperature. However, if the gaseous subsulfide forming agent is to be recycled, the lowest temperature should be above the volatilization temperature of the agent.

Doped semiconductor materials can also be prepared by the present process. The source material may contain doped semiconductor materials and dopant substances such as, for example, dioborane, phosphine, and $P_4S_3$ and the like can be added to the reaction gas in amounts sufficient to provide doped semiconductor materials as is well known in the art.

The reactor employed in the present novel process should be constructed of a material which will withstand the temperatures and pressures employed herein and which is substantially non-reactive with the reactants and reaction products. Such materials include, for example, graphite, silica, tantalum, molybdenum and the like.

The following examples are provided to more fully illustrates the invention but are not to be construed to be limiting to the scope thereof.

EXAMPLE 1

A quartz tube having a gas inlet and outlet was loaded as follows: silicon metal particles of 99.999 percent purity and ranging from about 4 to 20 mesh in size were placed in the gas inlet. A "seed" of pure monocrystalline silicon was positioned above the silicon metal granules at a distance of about 10 cm. The silicon metal particles were heated to about 1300° C. and a flow of $H_2S$ at a rate of about 10 cc./min. was passed through the particles. The "seed" metal was heated such that a temperature gradient of from 225° C. to 1200° C. was maintained over the 25 cm. of its length. The exit gases were vented through a one-way valve from the system. These conditions were maintained for about 4 hours after which time the flow of $H_2S$ was stopped and the reactor cooled. The "seed" metal was removed from the reactor and analyzed. A deposit of silicon metal was found on the substrate in the zone having a temperature of from about 800° to 950° C., this ranged in thickness of from about 7.5 to about 75 microns. Silicon was also deposited on the quartz reactor wall in the same temperature range. A second deposit, identified as sulfides of silicon, was found on the substrate in the zone having a temperature of less than about 800° C. The silicon deposit was further found to be monocrystalline with an electrical resistivity of about 49.6 ohm-cm. indicating high purity electrical component grade silicon semiconductor material. In addition small quantities of needle-like crystals of silicon were found loosely adhered to the reactor walls.

To illustrate the effectiveness of the present method to produce pure semiconductor materials from semiconductor source materials containing impurities, a second run was conducted employing essentially the same operating conditions as set forth immediately above, except that the process was run for 3 hours duration and the source material consisted of silicon metal of only about 98 percent purity. A deposit of monocrystalline silicon metal was on the substrate in the zone having a temperature of from about 800° C.–950° C. and ranged in thickness of from about 7.5 to 75 microns. Polycrystalline silicon was deposited on the quartz wall adjacent to the monocrystalline deposit. A deposit identified as sulfides of silicon was found in the quartz tube in the area having a temperature of less than about 800° C. Between the monocrystalline silicon deposit and the polycrystalline deposit was a growth of silicon needles. These needles were about 0.1 mm. in diameter and about 1 cm. long and were mixed single and polycrystalline. The silicon metal deposit that was found to be monocrystalline, had an electrical resistivity of from about 5 to about 42 ohm-cm., thus comparing favorably with the silicon layer prepared from the substantially pure silicon source material.

EXAMPLE 2

Fourteen grams of an impure silicon metal source was heated with a mixture of 150 g. $Al_2S_3$ and 90 g. $SiO_2$ [to produce $SiS_2$ in situ] in a graphite crucible at 1250° C. over a 4 hour period. The reactor was contained in a protective quartz shell. An argon stream was provided such that the flow of gas was from the heated portions of the crucible. After the reaction time the crucible and contents were cooled to room temperature. Silicon metal needles were found in the upper portion of the crucible protruding from the wall. X-ray diffraction examination characterized the needles as having a crystallographic axis along the [111] direction. The needles appeared to be made up of single crystals all having the same orientation. The X-ray diffraction study of the needles was made using Mo radiation with a Zr filter. The needles were of various sizes but had a length to width ratio of from about 20:1 to greater than 500:1 and the largest measured about 1 inch in length.

EXAMPLE 3

An impure reaction mass consisting of 35 g. of silicon, 40 g. $SiS_2$, 10 g. $SiO_2$, and 20 g. of an aluminum alloy (65% Al, 14% Si, 11% Ti, 8% Fe and 2% Mn) was heated at 1400° C. in a graphite crucible for 2.5 hours. Argon was used as an inert atmosphere. The reactor was contained in a quartz shell. After cooling and dismantling, a growth of silicon metal needles was recovered in the cooler portion of the crucible. The needles were similar in appearance to those prepared in Example 2.

The needles were analyzed by X-ray diffraction and indicated that both polycrystalline and monocrystalline needles were produced. They were grown along the [111] crystallographic axis. Needle diameter varied from 700 to 500 microns and displayed a variety of cross sectional shapes—hexagonal, rectangular, round, etc. Lengths from 5 to 30 mm. were observed. Electrical resistivity was measured along the length of the crystal and values of 0.2 and 0.6 ohm-cm. were observed.

In a manner similar to that illustrated in the foregoing examples other semiconductor materials can be produced from semiconductor source materials. For example, cadmium sulfide semiconductor material can be produced in the following manner: a quartz tube is positioned in an electric furnace arrangement such that the temperatures along the length of the tube can be controlled at different levels. A sample of Cd containing less than about 0.1% impurities is employed as the sub-sulfide forming agent and is placed in a quartz boat and positioned in one end of the tube. In the center section of the tube a quantity of CdS containing less than about 1% impurities is placed. The ends of the tube are then fitted with caps that allow control of the atmosphere within the tube. Heat is supplied to the tube such that the center section is maintained at about 1400° C., the end containing the Cd metal is maintained at 725° C. and a portion of the tube near the opposite end is maintained at temperatures varying from 800° C. to 1200° C. A flow of argon preheated to approximately 750° C., is passed over the boat containing the Cd at a rate of about 100–200 $cm.^3$ per minute. The flow of Ar is directed over the Cd, through the CdS and ejected at the opposite end. The tube is cooled and dismantled after a reaction time of about 6 hours. A deposit of substantially pure CdS semiconductor material usually containing less than 1 p.p.m. of impurities will be formed on the inner wall of the quartz tube corresponding to a temperature range of about 800° C.–1200° C.

GaAs of high purity can be produced in a similar manner to that described in the previous example. Impure GaAs, for example, containing about 1% impurities is placed in the center section of the quartz tube. The tube is heated until the center section reaches 1200° C. and a second section of the tube is maintained at between about 800° C. to 1100° C. Sulphur gas, preheated to about 1200° C. is passed over the impure GaAs at about 20 cc./min. and the gas stream directed through the 800–1100° C. section. These conditions are maintained for about 4 hours and then cooled. Substantially pure GaAs semiconductor material will be deposited on the wall of the tube in the zone corresponding to a temperature range of from about 800 to 1100° C. The deposit will usually consist of a dense film from which needle shaped crystals will be protruding. Various other products such as sulfides of Ga will be deposited in other temperature zones separate from the GaAs semiconductor material.

Various modifications can be made in the present invention without departing from the spirit or scope thereof for it is understood that we limit ourselves only as defined in the appended claims.

We claim:

1. A process for producing semiconductor materials from impurity-containing semiconductor source materials which comprises performing the following steps under an inert atmosphere which is substantially free of hydrogen in excess of that produced by the reactants:

(a) contacting an impurity containing semiconductor source material with a subsulfide forming agent, at a sufficient temperature and pressure to form a gaseous product mixture containing gaseous subsulfides of at least a portion of the semiconductor material present in said source material, said impurities in said source material being members selected from the group consisting of non-subsulfide forming materials or materials forming subsulfides having a volatility different from that of the subsulfides of the semiconductor material, and [wherein the subsulfide forming agent is further characterized in that when the semiconductor source material contains sulfide salt semiconductor materials the subsulfide forming agent consists of the elemental form of the cation corresponding to the cation of the sulfide salt semiconductor material and when the semiconductor source material contains semiconductor materials other than sulfide salt semiconductor materials the subsulfide forming agent is a sulfur containing source selected from the group consisting of sulfur, $H_2S$, normal valent metal sulfide compounds, and mixtures of $H_2S$, S and one normal valent metal sulfide compound];

(b) dissociating the gaseous semiconductor subsulfide by lowering the temperature of the gaseous product temperature below the subsulfide formation temperature of the desired semiconductor material; and (c) precipitating and recovering semiconductor material.

2. The process as described in claim 1 wherein the process is carried out under reduced pressure.

3. The process as defined in claim 1 including in addition: dissociating and precipitating semiconductor materials, less volatile materials, and more volatile materials at different temperatures along a temperature gradient.

4. The process as defined in claim 1 wherein the impurity-containing semiconductor source material contains at least 1000 p.p.m. if impurities.

5. The process as defined in claim 1 including in addition: precipitating semiconductor materials as an epitaxial layer on a substrate.

6. The process as defined in claim 1 wherein the impurity containing semiconductor source material contains a material selected from the group of semiconductors and semiconductor formers consisting of Si, Ge, Se, Cd, Zn, GaAs, InSb, CdS, and ZnS.

7. The process as defined in claim 1 wherein dissociation is conducted in the presence of an inert diluent gas.

8. The process as defined in claim 1 wherein the dissociation is conducted in the presence of an inert gas selected from the group consisting of Ar, He, Ne, Kr, Xe and mixtures thereof.

9. The process as defined in claim 1 wherein said semiconductor source material contains sulfide salt semiconductor materials and said subsulfide forming agent consists of the elemental form of the cation corresponding to the cation of the sulfide salt semiconductor material.

10. The process as defined in claim 1 wherein said semiconductor source material is a metallic or intermetallic mixture of elements from Group II, III, IV, V and VI of the A and B columns of the Periodic Table and said subsulfide forming agent is sulfur, $H_2S$, a normal valent metal sulfide compound or mixtures of $H_2S$, S and one normal valent metal sulfide compound.

11. The process as defined in claim 10 wherein the subsulfide forming agent is sulfur, normal valent sulfide compounds of semiconductor materials or mixtures thereof.

12. The process as defined in claim 10 wherein the subsulfide forming agent is provided in an amount at the maximum about equal to that stoichiometrically required to form the subsulfide of the most volatile element in the intermetallic semiconductor compound.

13. In the method for transporting semiconductor materials by means of chemical vapor transport reactions, the improvement which comprises performing the following steps under an inert atmosphere which is substantially free of hydrogen in excess of that produced by the reactants:

(a) contacting a semiconductor source material with a subsulfide forming agent at a sufficient temperature to form a gaseous product mixture containing gaseous subsulfides of at least a portion of the semiconductor material; and (b) dissociating the gaseous semiconductor subsulfide by lowering the temperature of the gaseous product temperature below the subsulfide formation temperature of the desired semiconductor material; and (c) precipitating and recovering semiconductor material.

14. The method as defined in claim 13 wherein the semiconductor source material contains a material selected from the group of semiconductors and semiconductor formers consisting of Si, Ge, Se, GaAs, InSb, Cds, Cd, and ZnS.

15. The process as defined in claim 13 wherein the dissociation is conducted in the presence of an inert diluent gas.

16. The process as defined in claim 13 where the dissociation is conducted in the presence of an inert gas selected from the group consisting or Ar, He, Ne, Kr, Xe and mixtures thereof.

17. The process as defined in claim 13 wherein the process is carried out under reduced pressure.

18. The process as defined in claim 13 wherein a temperature gradient is provided in the area of dissociation.

19. The process as defined in claim 13 wherein said semiconductor source material contains sulfide salt semiconductor materials and said subsulfide forming agent consists of the elemental form of the cation corresponding to the cation of the sulfide salt semiconductor material.

20. The process as defined in claim 13 wherein said semiconductor source material is a metallic or intermetallic mixture of elements from Group II, III, IV, V and VI of the A and B columns of the Periodic Table and said subsulfide forming agent is sulfur, $H_2S$, a normal valent metal sulfide compound or mixtures of $H_2S$, S and one normal valent metal sulfide compound.

References Cited

UNITED STATES PATENTS 3,290,181 12/1966 Sirtl ______________ 148—1.6

OSCAR R. VERTIZ, Primary Examiner

H. S. MILLER, Assistant Examiner

U.S. Cl. X.R.

23—135, 204; 148—175; 252—62.3